(12) United States Patent
Clarke et al.

(10) Patent No.: US 7,071,091 B2
(45) Date of Patent: Jul. 4, 2006

(54) METHOD OF FORMING AIR GAPS IN A DIELECTRIC MATERIAL USING A SACRIFICIAL FILM

(75) Inventors: James S. Clarke, Portland, OR (US); Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 10/828,885

(22) Filed: Apr. 20, 2004

(65) Prior Publication Data

US 2005/0230836 A1    Oct. 20, 2005

(51) Int. Cl.
*H01L 21/4763*    (2006.01)

(52) U.S. Cl. ............ 438/622; 438/619; 438/421; 438/422

(58) Field of Classification Search ............. 438/619
See application file for complete search history.

(56) References Cited

U.S. PATENT DOCUMENTS

| 6,682,989 | B1 | 1/2004 | Goodner et al. | |
| 6,861,332 | B1* | 3/2005 | Park et al. | 438/421 |
| 6,867,125 | B1* | 3/2005 | Kloster et al. | 438/618 |
| 2002/0127844 | A1* | 9/2002 | Grill et al. | 438/622 |
| 2004/0087183 | A1 | 5/2004 | Goodner et al. | |

OTHER PUBLICATIONS

Toshiyuki Toyoshia et al., 0.1um Level Contact Hole Pattern Formation with KrF Lithography by Resolution Enhancement Lithography Assited by Chemical Shrink (RELACS), pp. 1-3 , Sep. of 1998.

Takashi Kanda et al., 100nm Contact Holes Using resolution Enhancement lithography Assited by Chemical Shrink, pp. 1-2, Autumn 1999.

Vincent Arnal et al., Optimization of CVD Dielectric Process to Achieve reliable Ultra Low-k Air Gas, pp. 1-6, 2002.

Gina L. Weibel et al., An Overview of Supercritial CO2 Applications in Mircroeletronics Processing, pp. 1-8, Apr. 25, 2002.

Eiectrochemical Society, H.J Lee et al. , X-Ray Reflectivity and FTIR Measurements of N2 Plasma Effects on the Density Profile of Hydrogen Silsesquioxane Thin Films, pp. 1-5, 2001.

K Maex et al., Journal of Applied Physics, Low Dielectric Constant Materials for Microelectronics, vol. 93, No. 11, pp. 1-49, Jun. 1, 2003.

* cited by examiner

*Primary Examiner*—Thanh Nguyen
(74) *Attorney, Agent, or Firm*—Kerry D. Tweet

(57) ABSTRACT

A method of forming air gaps surrounding conductors in a dielectric layer, the dielectric layer comprising, for example, part of the interconnect structure of an integrated circuit device. The air gaps are formed, in part, by depositing a sacrificial material within a trench and/or via that have been formed in a dielectric layer, and the sacrificial material is ultimately removed after metal deposition to create the air gaps. A porous dielectric cap may be deposited over the dielectric layer, and the sacrificial material may be removed through this porous dielectric layer. Other embodiments are described and claimed.

19 Claims, 8 Drawing Sheets

US 7,071,091 B2

METHOD OF FORMING AIR GAPS IN A DIELECTRIC MATERIAL USING A SACRIFICIAL FILM

FIELD OF THE INVENTION

The invention relates generally to the manufacture of integrated circuit devices and, more particularly, to the fabrication of air gaps in a dielectric material.

BACKGROUND OF THE INVENTION

An integrated circuit (IC) device typically comprises a semiconductor die in which circuitry has been formed, this circuitry including a collection of circuit elements such as transistors, diodes, capacitors, resistors, etc. To provide electrical connections between the die and a next-level component (e.g., a package substrate), an interconnect structure is formed over a surface of the die. The interconnect structure may comprises a number of levels of metallization, each layer of metallization separated from adjacent levels by a layer of dielectric material (or other insulating material) and interconnected with the adjacent levels by vias. The dielectric layers of the interconnect structure are often each referred to as an "interlayer dielectric" (or "ILD"). The metallization on each layer comprises a number of conductors (e.g., traces) that may route signal, power, and ground lines to and from the circuitry formed on the die.

For some IC device applications, it may be desirable to increase the I/O (input/output) density of a semiconductor die while also reducing the size of the die. To achieve such a result, it may be necessary to decrease the spacing between conductive traces in the interconnect structure formed on the die. Space reductions include reducing the spacing between traces in the same level of metallization, as well as reducing the spacing between traces in adjacent metallization levels. As the spacing between conductors of an interconnect structure decreases, the potential for coupling capacitance between closely spaced traces and propagation delays may significantly increase. The coupling capacitance and propagation delays may be minimized by reducing the dielectric constant of the material—or, more generally, the "effective" dielectric constant of the space or volume—that separates the conductive traces of the interconnect structure.

One way to reduce the coupling capacitance and propagation delays is to utilize new materials having a low dielectric constant (k) to construct the ILD layers of the interconnect structure. However, the introduction of a new material into the manufacturing process may present numerous integration challenges, as the new material's characteristics may affect all facets of production (e.g., thin film deposition, lithography, etching, etc.).

Another solution for lowering the dielectric constant of the ILD layers of an interconnect structure is to introduce air gaps (k=1) proximate to the conductive traces, thereby reducing the effective dielectric constant of the space between adjacent traces. One scheme that has been suggested for the formation of air gaps is to form the traces in an LD layer, and then selectively remove the ILD material, leaving only the metal traces. The stand-alone metal traces may, however, lack adequate structural support.

A second approach that has been suggested for the formation of air gaps is to pattern the air gaps into the ILD next to the metal conductors. However, this approach will require additional lithography steps and, further, the feature size of the air gaps may exceed the limits of conventional lithography processes. In addition, air gap formation may necessitate the etching of a deep, narrow trench, which can be difficult to achieve.

DETAILED DESCRIPTION OF THE INVENTION

Disclosed in the following text are various embodiments of a method of forming air gaps in a dielectric (or other) material, as well as IC devices including such air gaps. In one embodiment, air gaps are formed in a dielectric or ILD layer of an interconnect structure, wherein the air gaps surround at least portions of the conductors running through this dielectric layer. According to the disclosed embodiments, air gaps may be fabricated into an existing dual-damascene structure (or other structure) using a sacrificial material that is ultimately removed. Thus, additional patterning steps can be avoided, and integration into existing processes may be simplified. Also, structural integrity of the interconnect structure may be maintained by application of a porous dielectric layer, as will be described below. The introduction of such air gaps into an ILD layer may provide for a decrease in the effective dielectric constant of the ILD layer.

Figure 1A:
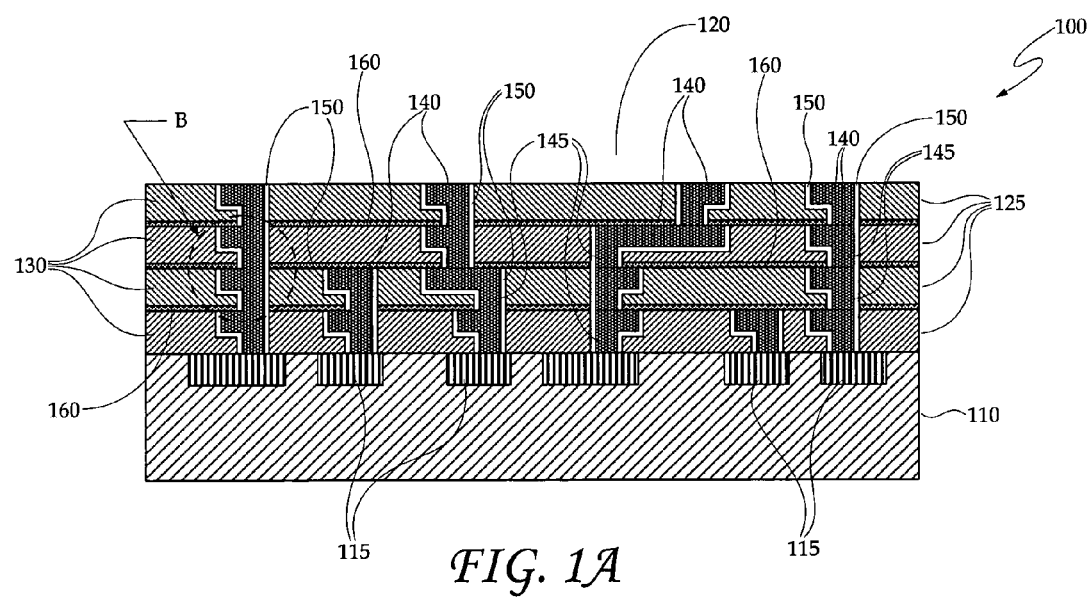
FIG. 1A is a cross-sectional schematic diagram illustrating an embodiment of an interconnect structure of a die, the interconnect structure including air gaps formed according to the disclosed embodiments.

Referring now to FIG. 1A, illustrated is an embodiment of an IC device 100 including air gaps formed according to the disclosed embodiments. The IC device 100 comprises a die 110 in which circuitry 115 has been formed. The circuitry 115 formed in die 110 may include a number of circuit elements (e.g., transistors, diodes, capacitors, resistors, etc.), as well as various signal lines that interconnect these elements. The die 110 may comprise any suitable semiconductor material, such as silicon (Si), silicon-on-insulator (SOI), gallium arsenide (GaAs), etc.

Disposed on the die 110 is an interconnect structure 120. The interconnect structure 120 includes a number of levels of metallization 125. Each level of metallization 125 comprises a layer of dielectric material 130 in which a number of conductors 140 (e.g., traces) has been formed. The conductors 140 in any given level of metallization 125 are separated from the conductors of adjacent levels by the dielectric material 130, and the conductors 140 of adjacent levels 125 are electrically interconnected by conductive vias 145 extending between these levels. The conductors 140 and vias 145 may comprise any suitable conductive material, such as copper (Cu), aluminum (Al), gold (Au), silver (Ag), or alloys thereof. The dielectric material 130 may comprise any suitable dielectric or insulating material, such as silicon dioxide ($SiO_2$), SiOF, carbon-doped oxide (CDO), a glass, or a polymer material.

Figure 1B:
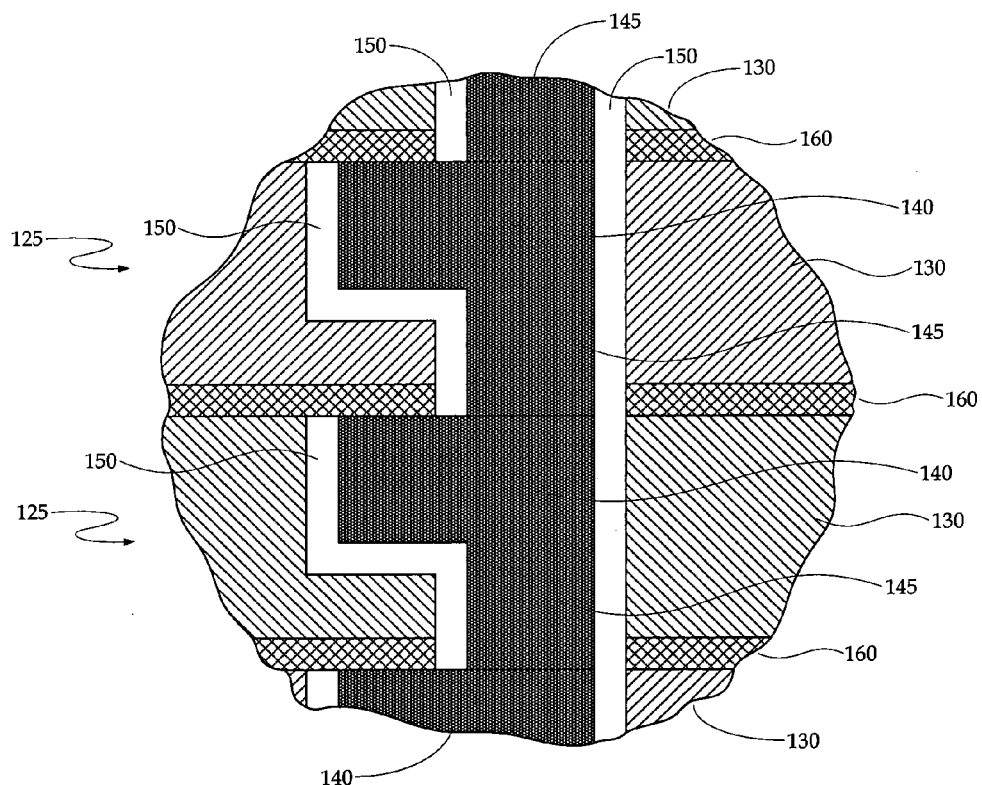
FIG. 1B is a schematic diagram showing an enlarged portion of the interconnect structure of FIG. 1B, which shows air gaps formed according to the disclosed embodiments.

Surrounding the conductors 140 and vias 145 are air gaps 150. The air gaps 150 are illustrated in greater detail in FIG. 1B, which shows an enlarged portion of the interconnect structure 120 (the portion identified by reference numeral B in FIG. 1A). Referring to FIG. 1B in conjunction with FIG. 1A, at least portions of each conductor 140 and each via 145 are surrounded by one of the air gaps 150. Also, disposed over the dielectric material layer 130 of each level 125 (except the top level) is a layer of a porous dielectric material 160. Embodiments of the formation of the air gaps 150 and application of the porous dielectric layer 160 are described below in greater detail. The air gaps 150 (k=1) formed in the dielectric material layers 130 (e.g., $2.5 \leq k \leq 4.5$) can reduce the effective dielectric constant of these insulating layers, thereby reducing coupling capacitance and propagation delays.

Figure 1C:
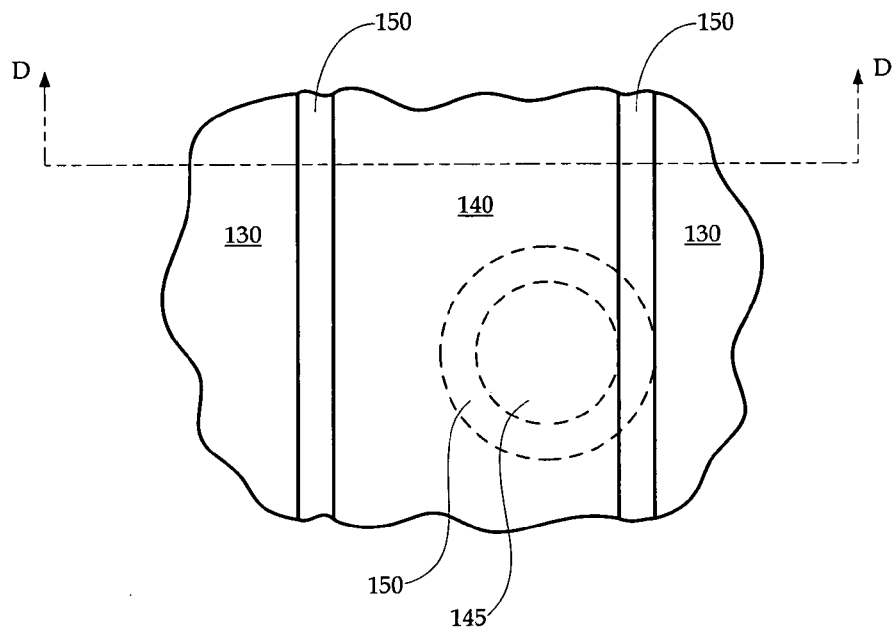
FIG. 1C is a schematic diagram illustrating a plan view of one of the dielectric layers shown in FIG. 1B.
Figure 1D:
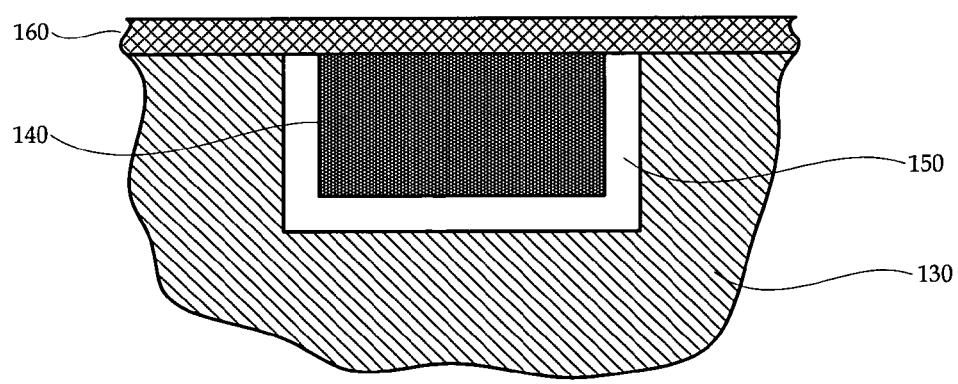
FIG. 1D is a schematic diagram illustrating a cross-sectional view as taken along line D—D of FIG. 1C.

It should be understood that the air gaps 150, although shown in cross-section in FIGS. 1A and 1B, may at least partially (or fully) surround the conductors 140 and/or vias 145. This is further illustrated in FIGS. 1C and 1D, wherein FIG. 1C shows a plan view of one of the dielectric layers 130 of FIG. 1B (with the porous dielectric layer removed), and FIG. 1D shows a cross-section of the structure of FIG. 1C as taken along line D—D. Referring to FIGS. 1C and 1D, it can be seen that the conductor 140 and via 145 shown in these figures are at least partially surrounded by the air gaps 150. However, it should be understood that portions of any conductor or via may not be surrounded by an air gap. For example, as shown in FIG. 1D, a portion of the conductor 140 lies adjacent to a layer of porous dielectric material 160.

Figure 2:
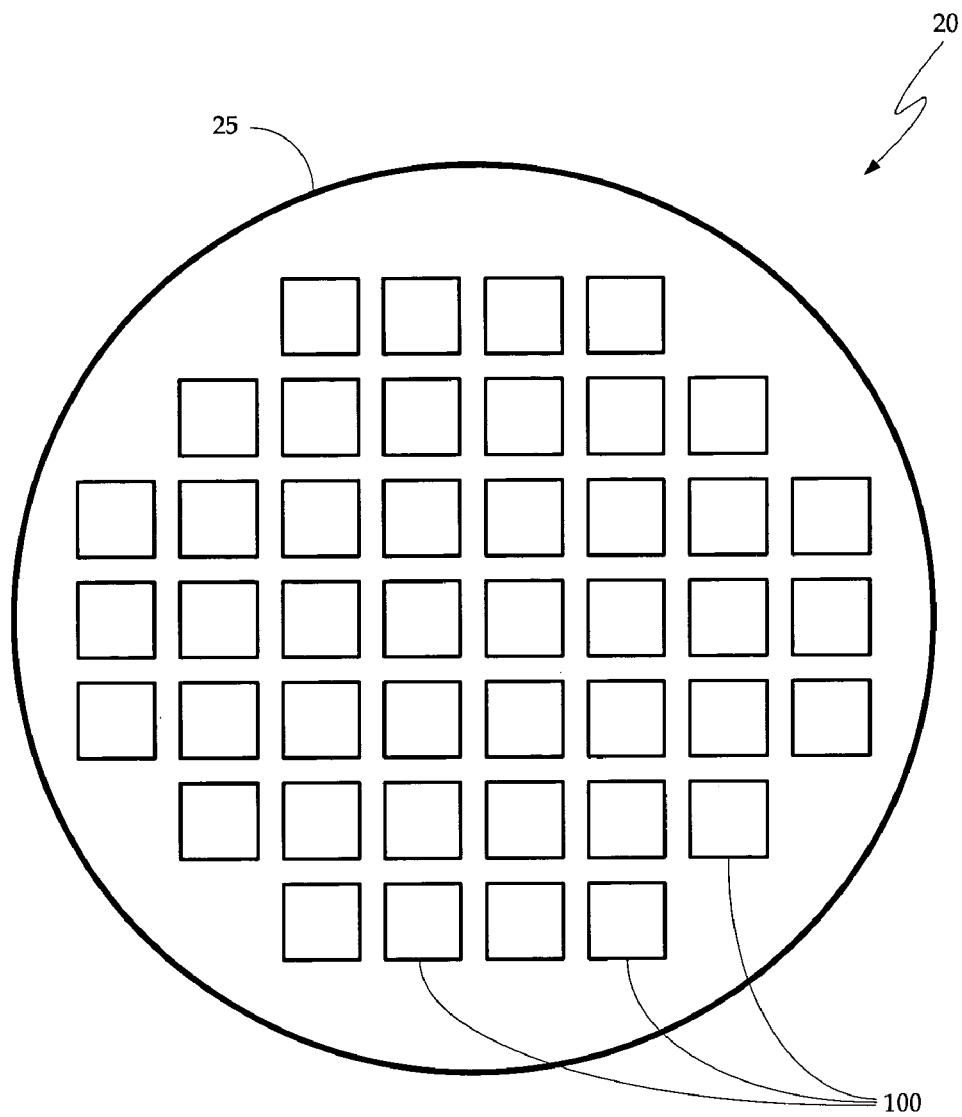
FIG. 2 is a schematic diagram illustrating an embodiment of a wafer upon which air gaps have been formed according to the disclosed embodiments.

Although one IC device 100 comprising a single die 110 is shown in FIG. 1A, it should be understood that the embodiments of a method for forming air gaps, which are to be described below, are typically performed at the wafer level. This is further illustrated in FIG. 2, which shows a plan view of a wafer 20. The wafer 20 comprises a substrate 25 (e.g., Si, SOI, GaAs, etc.) upon which integrated circuitry for a number of die 110 has been formed, and wafer 20 is ultimately cut into these separate die 110. Prior to singulation of the die 110, a number of levels of metallization will be formed over a surface of the wafer 20 to form the interconnect structure for each die 110 (e.g., the interconnect structure 120, as shown in FIG. 1A).

At this juncture, it should be noted that, in FIGS. 1A through 1D, only a limited number of circuit elements 115, conductors 140, and vias 145 are shown for ease of illustration. However, as the reader will appreciate, the integrated circuitry 115 formed on die 110 may, in practice, includes tens of millions, or even hundreds of millions, of individual circuit elements and, further, that the interconnect structure 120 may include several hundred or even thousands of conductors 140 and vias 145. Thus, it should be understood that FIGS. 1A–1D (as well as FIGS. 4A–4G) are simplified schematic representations of the IC device 100 presented merely as an aid to understanding the disclosed embodiments and, further, that no unnecessary limitations should be drawn from these schematic representations.

Figure 3:
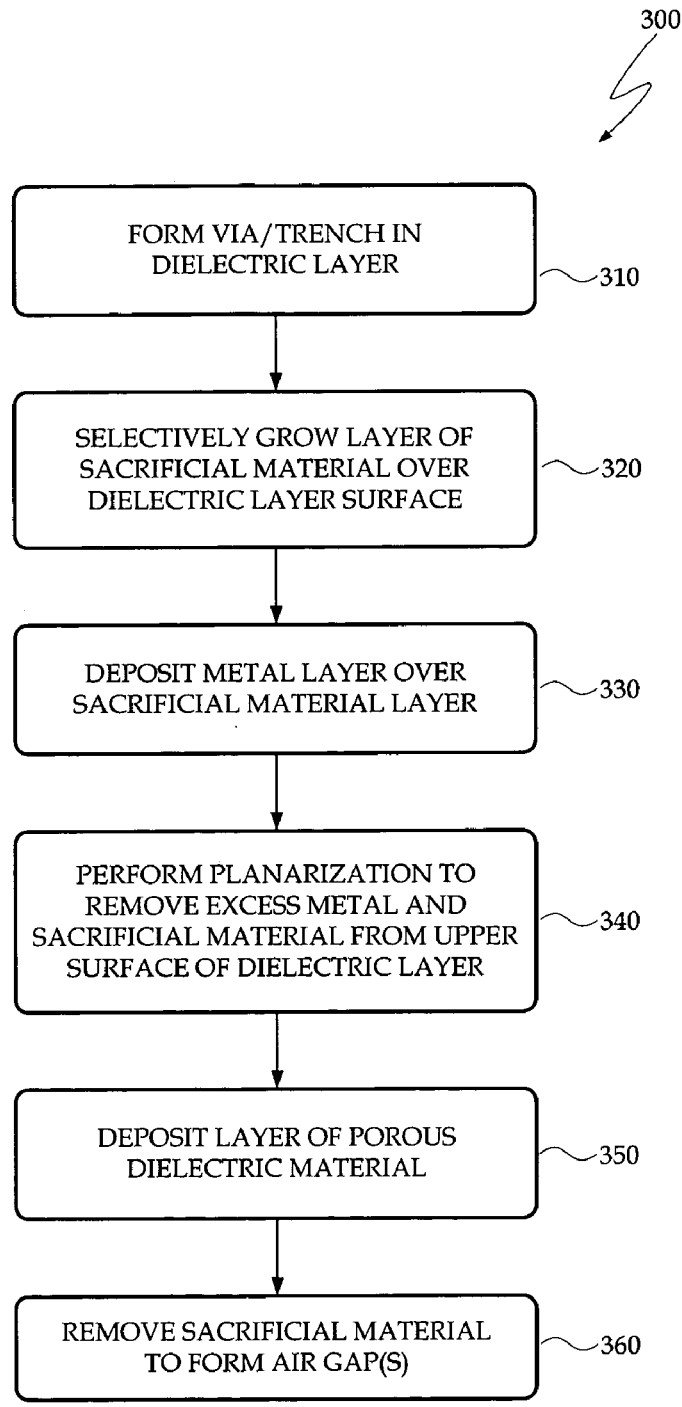
FIG. 3 is a block diagram illustrating an embodiment of a method of forming air gaps.

An embodiment of a method 300 of forming air gaps in a dielectric material is illustrated in FIG. 3. The method shown in FIG. 3 is further illustrated in the schematic diagrams of FIGS. 4A through 4G, and reference should be made to these figures as called out in the text.

Figure 4A:
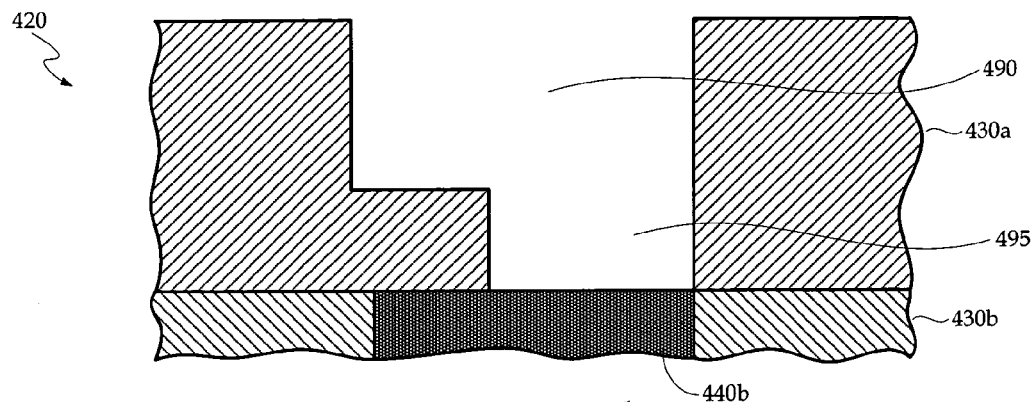
FIGS. 4A–4G are schematic diagrams which illustrate embodiments of the method shown in FIG. 2.

Turning now to FIG. 3, and block 310 in particular, a via and/or trench are formed in a dielectric layer. This is illustrated in FIG. 4A, which shows a portion of an interconnect structure 420. The interconnect structure 420 includes a layer of dielectric material 430a that overlies another layer of dielectric material 430b. Each of the dielectric layers 430a, 430b may comprise any suitable dielectric or insulating material (e.g., $SiO_2$, SiOF, CDO, glass, polymer, etc.). A trench 490 and a via 495 have been formed in the upper dielectric layer 430a. The underlying dielectric layer 430b includes a conductor 440b (e.g., a trench filled with a conductive material, such as copper), and the via 495 may extend down to this conductor 440b. In one embodiment, the trench 490 and via 495 are formed according to a via-first dual-damascene process (which may be either a full via-first process or a partial via-first process), and in another embodiment, the trench and via are formed according to a trench-first dual damascene process. It should be understood that other structures may be formed in the dielectric layer 430a (e.g., a trench only, a via only, etc.).

Figure 4B:
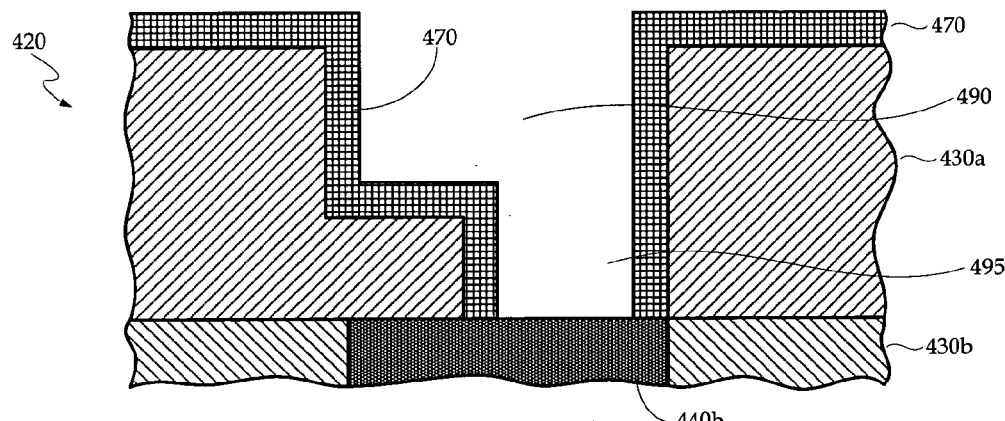

Referring to block 320, a layer of sacrificial material is then selectively deposited over the surfaces of the dielectric layer. This is illustrated in FIG. 4B, where a layer of sacrificial material 470 has been deposited over the dielectric layer 430a, but not on the exposed surface of the conductor 440b in the underlying layer 430b. The sacrificial material 470 may comprise any suitable material that can be selectively deposited or grown over the dielectric material layer 430a and not on the exposed surfaces of the conductor 440b. Further, the sacrificial material 470 should, in one embodiment, comprise a material that is amenable to removal, as described below. In one embodiment, the sacrificial material 470 is deposited to a thickness of between 5 nm and 15 nm, and in another embodiment, the sacrificial material is deposited to a thickness of approximately 10 nm. In a further embodiment, the sacrificial layers 470 on each side of the trench 490 may have a cumulative thickness up to approximately 30 percent of a width of the trench 490.

In one embodiment, the sacrificial material 470 comprises a polymer material. For example, according to one embodiment, the sacrificial material comprises a polymer material that can be deposited by a chemical growth process similar to the RELACS (Resolution Enhanced Lithography Assisted by Chemical Shrink) process used to grow polymer layers on photoresists (or other suitable chemical growth process). In this process, the surfaces of the dielectric layer 430a (but not the exposed conductor 440b) are selectively pretreated to provide an acidic surface, which may be accomplished by application of a siloxane film with a carboxylic acid chain. A layer of a polymer material (e.g., the sacrificial material) is then deposited over the dielectric layer. The structure is then heated, and polymerization of a polymer film occurs on the surfaces of the dielectric layer by acid catalyzation (from the pretreated acidic surface). After heating, a rinsing operation is performed to remove any excess un-polymerized material, wherein the final thickness of the polymer film (e.g., the sacrificial layer 470) grown on the dielectric layer is a function of the heating time and temperature. In one embodiment, the polymer material deposited by this chemical growth process comprises a water soluble resin and crosslinker. For example, the polymer material may comprise a resin from the poly-vinyl alcohol family, whereas the crosslinker may comprise an amine or phenol derivative.

According to another embodiment, the sacrificial layer 470 comprises a polymer material that is deposited by a photo induced-free radical polymerization process. In this process, the dielectric layer 430a needs to have easily abstractable hydrogen on the surface or otherwise be a "good" proton donor (note that the surface of conductor 440b, which typically comprises a metal such as copper, will not have easily abstractable hydrogen). The dielectric layer surfaces are then coated with a benzophenone solution and irradiated with ultra-violet (UV) light, causing surface functionalization by hydrogen abstraction which forms ketal moieties. A rinsing operation may be performed to remove excess benzophenone. Next, a material that is susceptible to free radical polymerization is then deposited over the dielectric layer surfaces, and the structure is again exposed to UV light. The benzophenone moieties serve as a surface photoinitiator, causing in situ polymerization of the material on the dielectric layer. After UV exposure, another rinse operation may be performed to remove any unreacted material, leaving a selectively grown polymer film over the surfaces of the dielectric layer. Polymer materials that may be deposited using photo induced-free radical polymerization include, for example, vinyl monomers (e.g., methyl methacrylate) and vinyl-functionalized engineering polymers (e.g., acrylate-endcapped polyimide).

In a further embodiment, the sacrificial material layer is deposited by a process that is not selective. In this embodiment, a conformal layer of the sacrificial material may be deposited, this conformal layer also overlying the conductor 440b in the underlying layer 430b. An anisotropic etch process may then be used to remove the sacrificial material from surfaces of the conductor 440b. Note that an anisotropic etch process may also remove the sacrificial material layer from the bottom of the trench 490; however, the sacrificial material would remain on the sides of the trench.

Figure 4C:
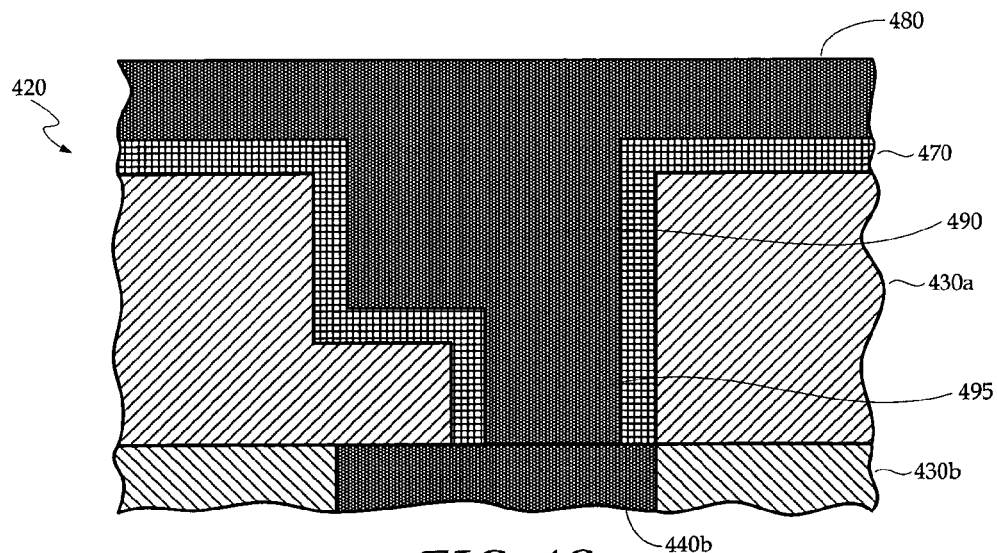

Returning to FIG. 3, a layer of metal (or other conductive material) is then deposited over the sacrificial material layer, as set forth in block 330. This is illustrated in FIG. 4C, which shows a metal layer 480 that has been deposited over the sacrificial layer 470 and the exposed surface of the underlying conductor 440b. In one embodiment, the metal layer 480 comprises a copper or copper alloy. However, this layer may comprise any other suitable conductive material, such as aluminum, gold, silver, or alloys thereof. The metal layer 480 may be deposited using any suitable blanket deposition technique, such as a sputtering or other physical vapor deposition (PVD) process, a chemical vapor deposition (CVD) process, etc. Also, a seed layer of the metal may be laid down prior to deposition, if desired.

Figure 4D:
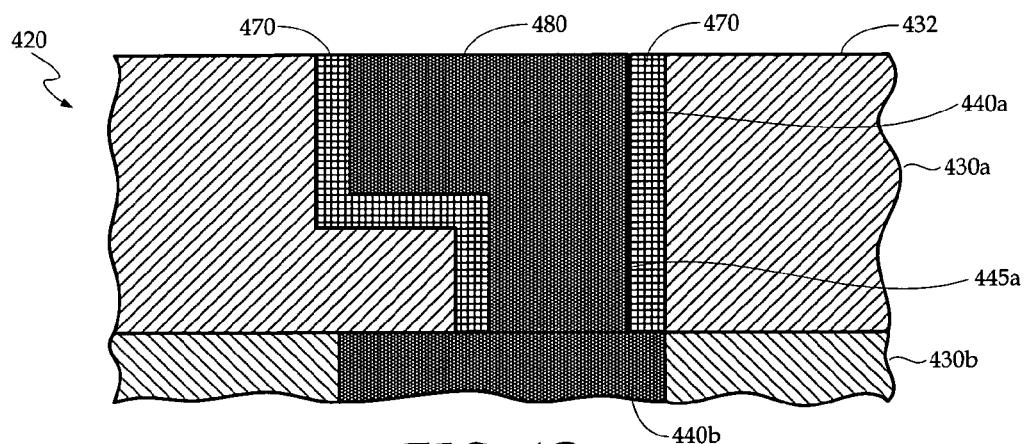

As set forth in block 340, a planarization process is performed to remove excess metal and sacrificial material from the upper surface of the dielectric layer. This is illustrated in FIG. 4D, where excess sacrificial and metal material 470, 480 has been removed to expose an upper surface 432 of the dielectric layer 430a. Any suitable planarization technique may be employed to remove the excess sacrificial and metal material, such as chemical-mechanical polishing (CMP). In alternative embodiments, the excess sacrificial and metal material may be removed using an etching process. Note that, as shown in FIG. 4D, the metal material 480 remaining in trench 490 forms a conductor 440a, and the metal material disposed in the via 495 forms a conductive via 445a.

Figure 4E:
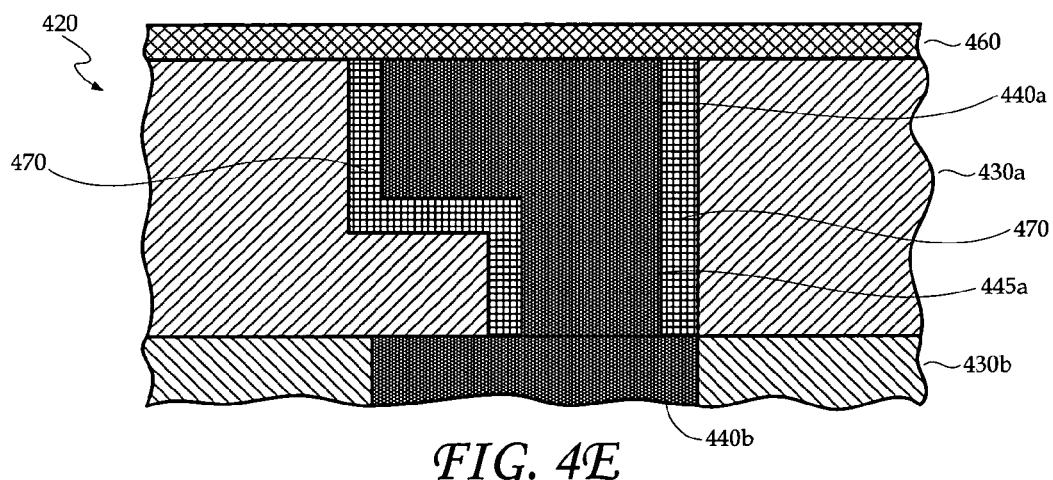

Referring next to block 350, a layer of a porous dielectric material is deposited over the dielectric layer, as well as exposed portions of the metal and sacrificial materials. This is illustrated in FIG. 4E, which shows a layer of porous dielectric material 460 that has been deposited over the dielectric layer 430a and exposed portions of the conductor 440a, as well as the exposed sacrificial material 470. The porous dielectric layer 460 may comprise any material possessing sufficient porosity (and/or other characteristics) to allow for removal of the sacrificial material layer 470, as will be explained below. By way of example, the porous dielectric material may comprise a silica based material, a silicon nitride based material, a silicon carbide based material, an amorphous carbon based material, or an organic film. The porous dielectric layer 460 will provide structural stability to the conductor 440a and via 445a after removal of the sacrificial layer (note that, ultimately another LD layer may be deposited over the porous dielectric layer, which can provide structural integrity for the porous dielectric layer). Also, due to its porosity (e.g., air pockets), the porous dielectric layer may have a relatively lower dielectric constant in comparison to the dielectric material layer 430a. Any suitable blanket deposition technique may be used to form the porous dielectric layer (e.g., CVD, PVD, etc.). The porosity of this layer may be a characteristic of the material itself, or this layer's porosity may be the result of the deposition technique used to form this layer (or a combination of both).

In one embodiment, in addition to formation of the porous dielectric cap 460, the dielectric layer 430a may itself be fabricated from a porous material in order to reduce its dielectric constant. For this embodiment, the sacrificial material layer 470 may function as a pore sealing layer during deposition of metal layer 480, thereby preventing diffusion of the metal material into the pores of the surrounding porous material.

Figure 4F:
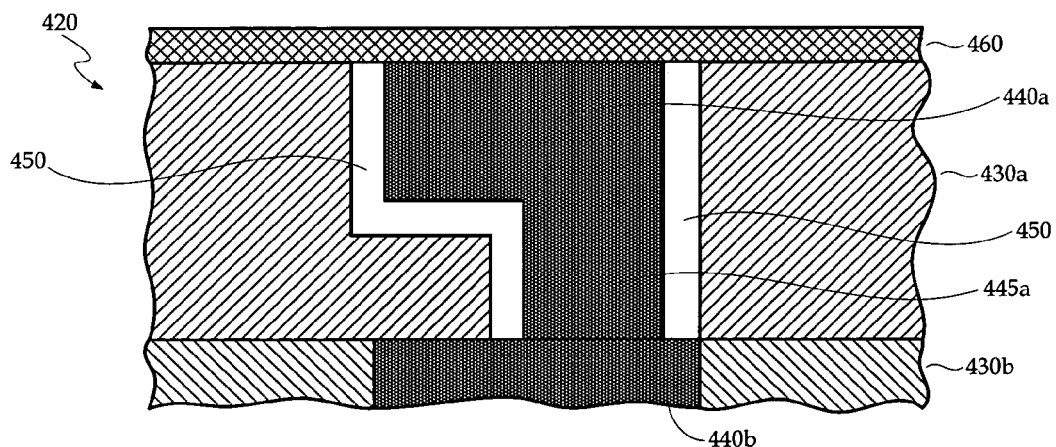

As set forth in block 360, the sacrificial material is then removed to form air gaps. This is illustrated in FIG. 4F, where the sacrificial material has been removed to form air gaps 450. In one embodiment, the air gaps 450 have a thickness of between 5 nm and 15 nm, and in another embodiment, the air gaps have a thickness of approximately 10 nm. In a further embodiment, the air gaps 450 on each side of the conductor 440a may have a cumulative thickness up to approximately 30 percent of a width of the trench 490 in which the conductor 440a is formed.

The sacrificial material may be removed by a process that can extract the sacrificial material through the porous dielectric layer 460. In one embodiment, the sacrificial material is removed using a combination of a thermal decomposition process followed by a rinsing process to remove the decomposition residues. For example, the sacrificial material may be heated to induce thermal decomposition and, following this, a supercritical $CO_2$ solution may be used to remove any remaining residues of the thermal decomposition process. In one embodiment, the sacrificial material comprises a material that will thermally decompose at temperatures less than approximately 300 degrees C., and in a further embodiment the sacrificial material comprises a material that will thermally decompose at temperatures les than approximately 450 degrees C. Supercritical $CO_2$ has the high diffusivity of a gas, which allows this solution to access the sacrificial material through the pores of the overlying porous dielectric layer. However, supercritical $CO_2$ also has the solvating capability approaching that of a liquid and, therefore, this solution can wash away the thermal decomposition products. Where the sacrificial layer comprises, for example, a methacrylate film, the methacrylate will thermally decompose into methacrylate monomers, which can then be removed by a supercritical $CO_2$ rinse.

Figure 4G:
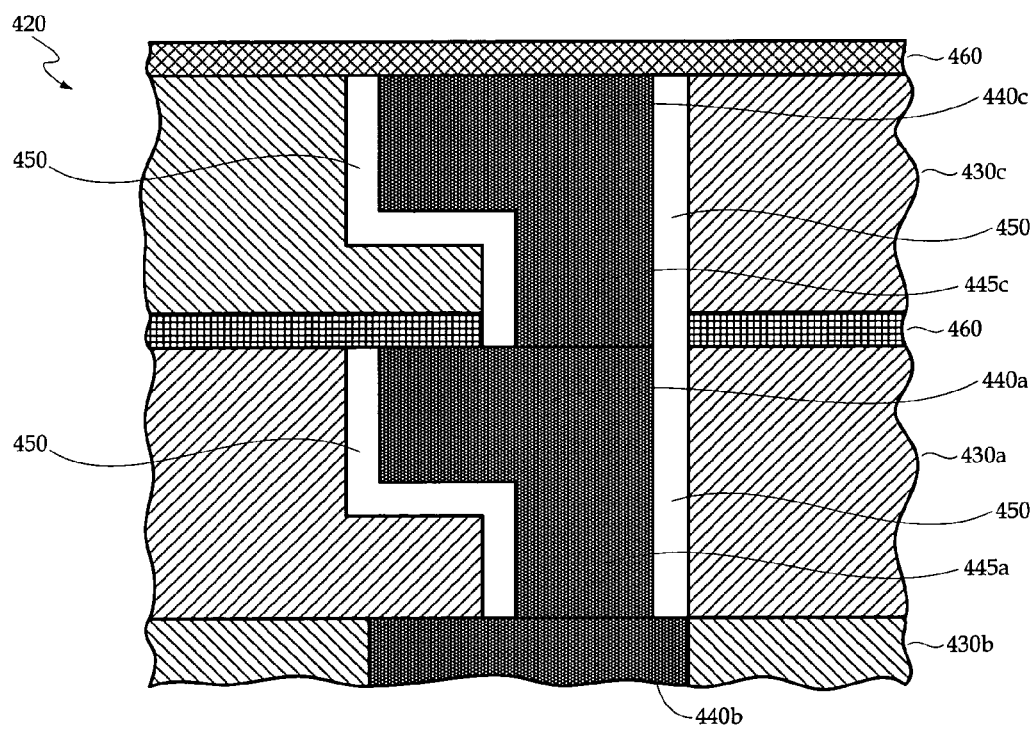

The above-described process shown and FIG. 3 and in FIGS. 4A–4F can then be used to form additional levels of metallization in the interconnect structure. This is illustrated, by way of example, in FIG. 4G, where an additional layer of dielectric material 430c has been deposited on the existing structure (e.g., that of FIG. 4F). A conductor 440c and via 445c surrounded by air gaps 450 have been formed in this additional dielectric layer 430c, and a porous dielectric cap 460 has also been formed over this dielectric layer, as shown in FIG. 4G. The process for forming the air gaps 450 in the dielectric layer 430c is similar to that previously described; however, it should be noted that the via—e.g., the via 445c and surrounding air gaps 450—should be etched through the porous dielectric layer 460 (that overlies layer 430a) and down to the conductor 440a. When the via is etched down to the conductor 440a, the air gap 450 surrounding this conductor may be exposed. In one embodiment, the small width of the air gaps will prevent any agents (e.g., solvents used during growth of the sacrificial layer) from entering the air gaps due to the effects of surface tension.

Figure 5:
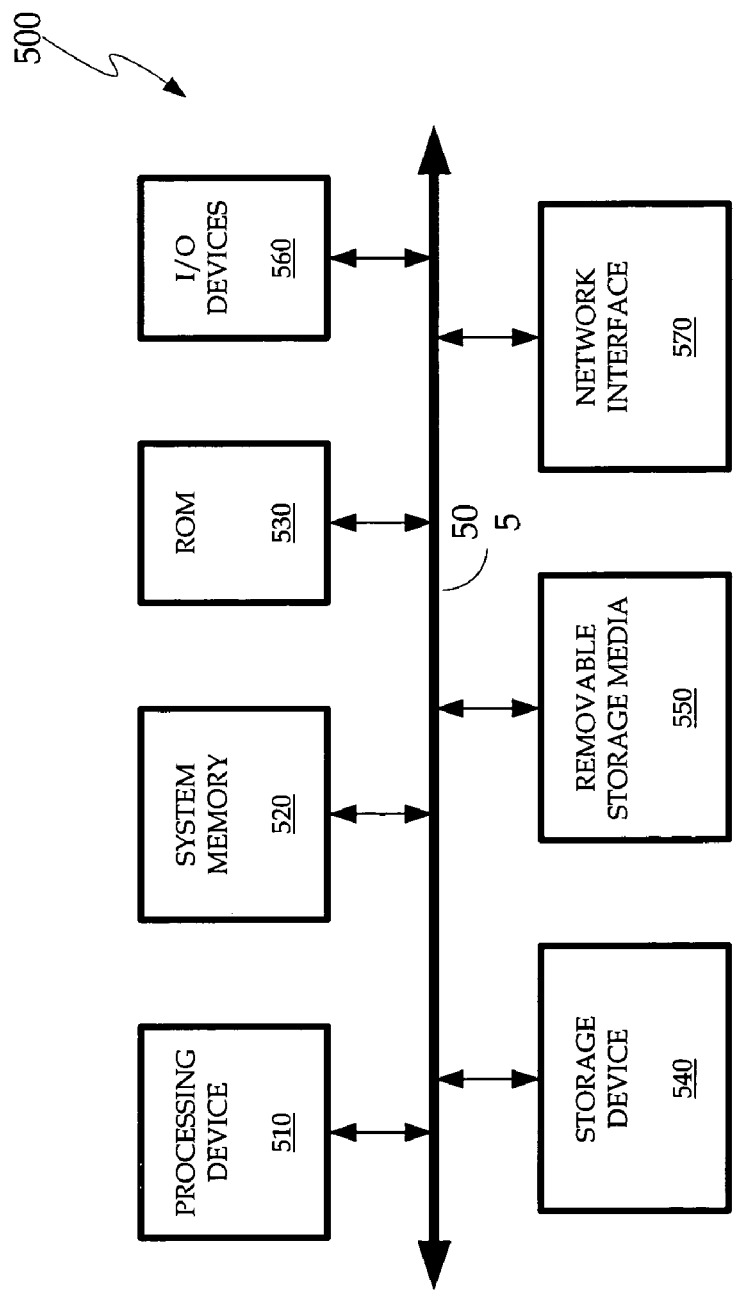
FIG. 5 is a schematic diagram illustrating an embodiment of a computer system, which may include a component formed according to the disclosed embodiments.

Referring to FIG. 5, illustrated is an embodiment of a computer system 500. Computer system 500 includes a bus 505 to which various components are coupled. Bus 505 is intended to represent a collection of one or more buses—e.g., a system bus, a Peripheral Component Interface (PCI) bus, a Small Computer System Interface (SCSI) bus, etc.—that interconnect the components of system 500. Representation of these buses as a single bus 505 is provided for ease of understanding, and it should be understood that the system 500 is not so limited. Those of ordinary skill in the art will appreciate that the computer system 500 may have any suitable bus architecture and may include any number and combination of buses.

Coupled with bus 505 is a processing device (or devices) 510. The processing device 510 may comprise any suitable processing device or system, including a microprocessor, a network processor, an application specific integrated circuit (ASIC), or a field programmable gate array (FPGA), or similar device. It should be understood that, although FIG. 5 shows a single processing device 510, the computer system 500 may include two or more processing devices.

Computer system 500 also includes system memory 520 coupled with bus 505, the system memory 510 comprising, for example, any suitable type and number of memories, such as static random access memory (SRAM), dynamic random access memory (DRAM), synchronous DRAM (SDRAM), or double data rate DRAM (DDRDRAM). During operation of computer system 500, an operating system and other applications may be resident in the system memory 520.

The computer system 500 may further include a read-only memory (ROM) 530 coupled with the bus 505. During operation, the ROM 530 may store temporary instructions and variables for processing device 510. The system 500 may also include a storage device (or devices) 540 coupled with the bus 505. The storage device 540 comprises any suitable non-volatile memory, such as, for example, a hard disk drive. The operating system and other programs may be stored in the storage device 540. Further, a device 550 for accessing removable storage media (e.g., a floppy disk drive or a CD ROM drive) may be coupled with bus 505.

The computer system 500 may also include one or more I/O (Input/Output) devices 560 coupled with the bus 505. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 500.

The computer system 500 further comprises a network interface 570 coupled with bus 505. The network interface 570 comprises any suitable hardware, software, or combination of hardware and software that is capable of coupling the system 500 with a network (e.g., a network interface card). The network interface 570 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 500 illustrated in FIG. 5 is intended to represent an exemplary embodiment of such a system and, further, that this system may include many additional components, which have been omitted for clarity and ease of understanding. By way of example, the system 500 may include a DMA (direct memory access) controller, a chip set associated with the processing device 510, additional memory (e.g., a cache memory), as well as additional signal lines and buses. Also, it should be understood that the computer system 500 may not include all of the components shown in FIG. 5.

In one embodiment, the integrated circuit device 100 of FIG. 1A—which has air gaps 150 formed according to the disclosed embodiments—comprises a component of the computer system 500. For example, the processing device 510 of system 500 may be embodied as the IC device 100. However, it should be understood that other components of system 500 (e.g., system memory 520, network interface 570, etc.) may include a device that is embodied as the IC device 100.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
   forming a trench and a via in a layer of dielectric material, the via having one end opening into the trench and an opposing end extending down to a conductor in an underlying layer;
   selectively depositing a layer of a sacrificial material over the dielectric material layer and over surfaces of the trench and via;
   depositing a layer of a conductive material over the sacrificial material layer and the conductor in the underlying layer;
   removing excess conductive material and excess sacrificial material from an upper surface of the dielectric material layer;
   depositing a layer of a porous dielectric material over the upper surface of the dielectric material layer and exposed portions of the conductive and sacrificial material layers; and
   removing the sacrificial material to form air gaps surrounding the conductive material within the trench and the via.

2. The method of claim 1, wherein the sacrificial material layer comprises a polymer material.

3. The method of claim 2, wherein the sacrificial material layer is deposited using a chemical growth process.

4. The method of claim 2, wherein the sacrificial material layer is deposited using a photo induced-free radical polymerization process.

5. The method of claim 1, wherein the conductive material comprises copper.

6. The method of claim 1, wherein the excess conductive and sacrificial materials are removed from the upper surface of the dielectric material layer using a chemical-mechanical polishing (CMP) process.

7. The method of claim 1, wherein the porous dielectric material comprises a silica based material, a silicon nitride based material, a silicon carbide based material, an amorphous carbon based material, or an organic film.

8. The method of claim 1, wherein removing the sacrificial material comprises:
   thermally decomposing the sacrificial material layer into one or more residue materials; and
   performing a rinse process to remove the residue materials through the porous dielectric layer.

9. The method of claim 8, wherein thermal decomposition is performed at a temperature up to approximately 450° C.

10. The method of claim 8, wherein the rinse process is performed using a supercritical $CO_2$ agent.

11. The method of claim 1, wherein the air gaps each have a thickness of between 5 nm and 15 nm.

12. The method of claim 1, wherein the underlying layer comprises another layer of dielectric material.

13. The method of claim 1, wherein the underlying layer comprises a semiconductor wafer.

14. A method comprising:
   forming a trench and a via in a layer of dielectric material, the via having one end opening into the trench and an opposing end extending down to a conductor in an underlying layer;
   depositing a layer of a sacrificial material over the dielectric material layer and over surfaces of the trench and via;
   etching the sacrificial material layer to remove at least a portion of the sacrificial material layer overlying the conductor in the underlying layer;
   depositing a layer of a conductive material over the sacrificial material layer and the conductor in the underlying layer;
   removing excess conductive material and excess sacrificial material from an upper surface of the dielectric material layer;
   depositing a layer of a porous dielectric material over the upper surface of the dielectric material layer and exposed portions of the conductive and sacrificial material layers; and
   removing the sacrificial material to form air gaps surrounding the conductive material within the trench and the via.

15. The method of claim 14, wherein the sacrificial material layer comprises a polymer material.

16. The method of claim 14, wherein the conductive material comprises copper.

17. The method of claim 14, wherein the porous dielectric material comprises a silica based material, a silicon nitride based material, a silicon carbide based material, an amorphous carbon based material, or an organic film.

18. The method of claim 14, wherein removing the sacrificial material comprises:
   thermally decomposing the sacrificial material layer into one or more residue materials; and
   performing a rinse process to remove the residue materials through the porous dielectric layer.

19. The method of claim 14, etching the sacrificial material layer to remove at least a portion of the sacrificial material layer overlying the conductor in the underlying layer comprises performing an anisotropic etch process.

* * * * *

UNITED STATES PATENT AND TRADEMARK OFFICE
CERTIFICATE OF CORRECTION

PATENT NO. : 7,071,091 B2  
APPLICATION NO. : 10/828885  
DATED : July 4, 2006  
INVENTOR(S) : Clarke et al.

It is certified that error appears in the above-identified patent and that said Letters Patent is hereby corrected as shown below:

In column 1, at line 60, delete "LD" and insert --ILD--.
In column 6, at line 13, delete "LD" and insert --ILD--.

Signed and Sealed this

Tenth Day of April, 2007

JON W. DUDAS
*Director of the United States Patent and Trademark Office*